United States Patent [19]

Liptak

[11] Patent Number: 4,788,493

[45] Date of Patent: Nov. 29, 1988

[54] APPARATUS FOR DETECTING DIRECTION OF ELECTRIC POWER FLOW

[75] Inventor: J. Michael Liptak, Columbia, S.C.

[73] Assignee: Square D Company, Palatine, Ill.

[21] Appl. No.: 140,869

[22] Filed: Jan. 6, 1988

Related U.S. Application Data

[63] Continuation of Ser. No. 677,785, Dec. 4, 1984, abandoned.

[51] Int. Cl.[4] .................. G01R 7/02; G01R 19/14; H02P 3/14
[52] U.S. Cl. ........................ 324/140 R; 324/133; 324/134; 324/126; 324/107; 318/376
[58] Field of Search ............ 324/133, 134, 140 R, 324/141, 142, 107, 103 R, 102, 127, 126; 307/127; 318/376, 801, 759–762

[56] References Cited

U.S. PATENT DOCUMENTS

| Re. 29,079 | 12/1976 | Gilbert | 235/194 |
|---|---|---|---|
| 3,875,509 | 4/1975 | Milkovic | 324/142 |
| 3,944,852 | 3/1976 | Gilbert | 307/229 |
| 3,995,178 | 11/1976 | Gilbert | 307/271 |
| 4,058,768 | 11/1977 | Milkovic | 324/142 |
| 4,079,313 | 3/1978 | Callan | 324/142 |
| 4,217,545 | 8/1980 | Kusui et al. | 324/107 |
| 4,224,671 | 9/1980 | Sugiyama et al. | 364/483 |
| 4,230,979 | 10/1980 | Espelage et al. | 318/759 X |
| 4,263,653 | 4/1981 | Mecklenburg | 364/483 |
| 4,321,531 | 3/1982 | Marshall | 324/142 |
| 4,451,784 | 5/1984 | Milkovic | 324/142 |
| 4,514,677 | 4/1985 | Kaufman et al. | 318/759 |

Primary Examiner—Reinhard J. Eisenzopf
Assistant Examiner—Jack B. Harvey
Attorney, Agent, or Firm—Richard T. Guttman; A. Sidney Johnston

[57] ABSTRACT

An apparatus for measuring the direction of power flow through conductors connecting a load to a source of alternating electric current, the load being capable of generating electric current, and the source of alternating electric current being capable of accepting power flow from the load. The invention comprises at least one wattmeter connected so that the sum of their outputs is proportional to the power flow through the conductors and the sign of the sum of their outputs is indicative of the direction of the power flow. A detector is provided for detecting the sign of the output of the at least one wattmeter. The detector is capable of generating an indicator signal. The indicator signal has a first value when the power flows from the source of alternating electric current into the load and the indicator signal has a second value when power flows from the load into the source of alternating electric current. The wattmeters have at least one switch having contacts that close in response to application of pulsed voltage to the load. At least one sense electric current substantially proportional to the load current flows through the contacts so that the average current flow, including the sign, through the contacts is proportional to the electric power flowing into or out of the load. Also the wattmeters may have at least one switch which closes in response to pulsed current and have a sense electric current proportional to a load voltage.

20 Claims, 8 Drawing Sheets

APPARATUS FOR DETECTING DIRECTION OF ELECTRIC POWER FLOW

This is a continuation of application Ser. No. 677,785 filed on Dec. 4, 1984, now abandoned.

FIELD OF THE INVENTION

This invention relates to electric power flow measurement, and more particularly to detectors for the direction of electric power flow.

BACKGROUND OF THE INVENTION

A problem in the technology of detecting the direction of electric power flow is to obtain a fast response time in situations where the direction of power flow may reverse quickly. For example, in a variable frequency alternating current (AC) motor drive system conditions where the motor begins to overhaul, that is to generate electric power, can develop quickly. And when the motor begins to overhaul the electric power generated by the motor must be absorbed by the motor drive system in order to maintain smooth functioning of the system. For example, if power generated by the motor is not absorbed, bus voltages may rise beyond the capability of components, leading to component failure. The reversal of electric power flow must trigger switching activities in order that the electric power generated by the motor be absorbed.

Methods used in the past to detect the direction of electric power flow include detecting a bus voltage. Generally bus voltage tends to rise as electric power is generated by a load, particularly when the load usually absorbs electric power. A disadvantage of using bus voltage rise for detecting a rerversal of electric power flow is that the rise in voltage is a much slower process than is the reversal of electric power flow. Factors causing bus voltage to rise slowly include the use of filters to smooth out unwanted voltage fluctuations on the bus. And the filters naturally slow the rate of bus voltage rise in response to disturbances such as a change in the direction of electric power flow.

For example, in a variable frequency AC inverter used to drive an AC motor the inverter often draws its source of electric power from a direct current (DC) bus. A capacitor is connected across the bus as a filter in order to smooth out unwanted voltage fluctuations in the bus voltage. When a motor being driven by the inverter goes into overhauling conditions, then the electric power generated by the motor is rectified and fed back to the DC bus thereby charging the filter capacitor and causing the bus voltage to rise. However, the time required for the bus voltage to rise will be long when compared to the time required for the direction of electric power flow to reverse because the reversed electric power flow must first charge the capacitor in order to raise the bus voltage. In summary, bus voltage is a delayed indicator of electric power flow direction change.

Electronic power flow meters designed in the past have been either unsuitable or inconvenient for detecting rapid change in the direction of electric power flow. Examples of such electronic power flow meters are given in U.S. Pat. No. 4,217,545 issued to Kusui et al on Aug. 12, 1980, and U.S. Pat. No. 3,875,509 issued to Milkovic on Apr. 1, 1975, and U.S. Pat. No. 4,224,671 issued to Sugigama on Sept. 23, 1980. When electronic power flow meters such as disclosed in U.S. Pat. No. 3,875,509 are used in circuits using pulse width modulated (PWM) techniques, such as a voltage source PWM inverter, the time division multiplier clocks must be operated at inconveniently high clock rates. The clock rates must be well in excess of the inverter PWM carrier frequency to assure a reasonable measurement of the power flow to or from the inverter output. Expensive hardware must be used to achieve even modest measurement accuracy. Older mechanical type watt meters of the reversible drive type are too slow to be useful in detecting reversal in direction of electric power flow.

SUMMARY OF THE INVENTION

The invention solves the problem of quickly generating a signal indicating the direction of electric power flow when there is a rapid change in power flow direction. The invention provides an apparatus for measuring the direction of power flow through conductors connecting a load to a source of alternating electric current, the load being capable of generating electric current, and the source of alternating electric current being capable of accepting power flow from the load. The invention comprises at least two wattmeters connected so that the sum of their outputs is proportional to the power flow through the conductors and the sign of the sum of their outputs is indicative of the direction of the power flow. A detector is provided for detecting the sign of the output of the at least two wattmeters. The detector is capable of generating an indicator signal. The indicator signal has a first value when the power flows from the source of alternating electric current into the load and the indicator signal has a second value when power flows from the load into the source of alternating electric current.

Other and further aspects of the present invention will become apparent during the course of the following description and be reference to the accompanying drawings.

BRIEF DESCRIPTION OF THE DRAWINGS

Referring now to the drawings, in which like numerals represent like parts in the several views:

FIG. 8 shows a regenerator unit and FIG. 9 shows a dynamic braking unit.

DETAILED DESCRIPTION

Figure 1:
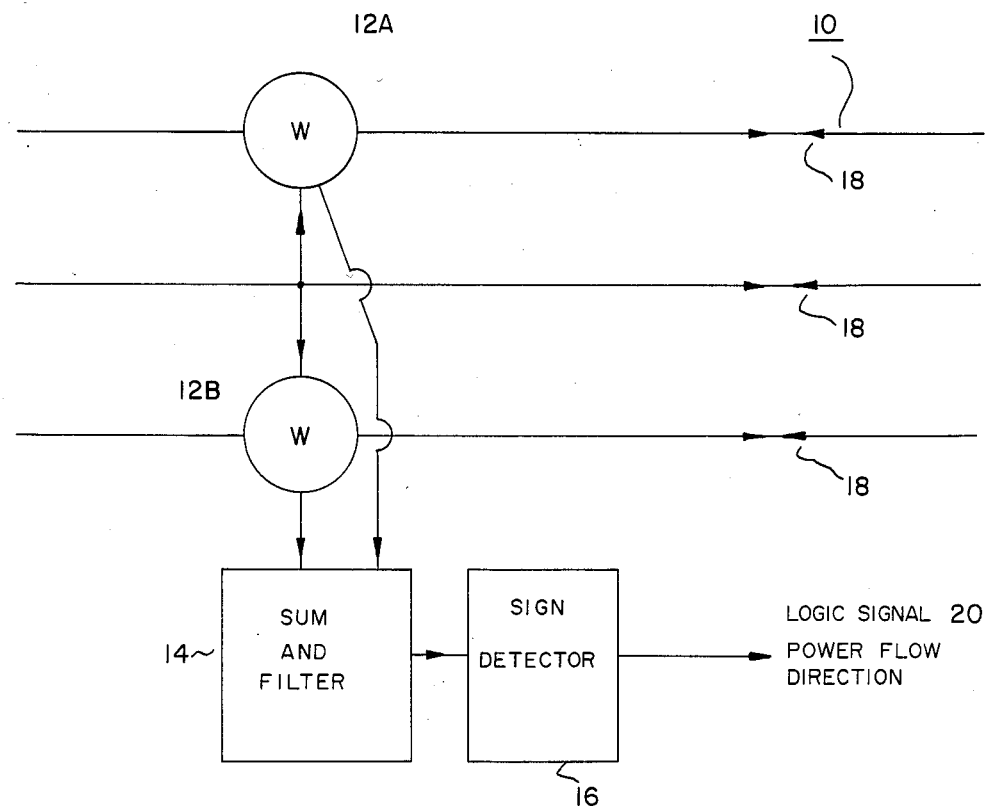
FIG. 1 is a block diagram of a power flow direction sensor apparatus.

FIG. 1 shows conductors 10 of a three phase alternating current (AC) power line. Wattmeter 12A and wattmeter 12B are connected to the conductors 10 of the three phase power line in a "two watt meter method" for measuring three phase electric power. The output of wattmeters 12A and 12B are connected to sum and filter circuit 14. The filtered output from sum and filter circuit 14 is connected to sign detector 16. The sign of the output of sum and filter circuit 14 depends upon the direction of flow of electric power in conductors 10. Arrows 18 indicate power flow in conductors 10 can be either to the right or to the left. In an illustrative example, the sign of the output sum and filter circuit 14 is positive for electric power flow to the right in conductors 10, and the sign is negative for power flow to the left in conductors 10. The output of sign detector 16 is logic signal 20. Logic signal 20 has a first value for a positive sign for the output of sum and filter circuit 14, and a second value for a negative sign for the output of sum and filter circuit 14. Thus, the first value of logic signal 20 indicates power flow to the right in conductors 10, and the second value of logic signal 20 indicates power flow to the left in conductors 10.

Figure 2:
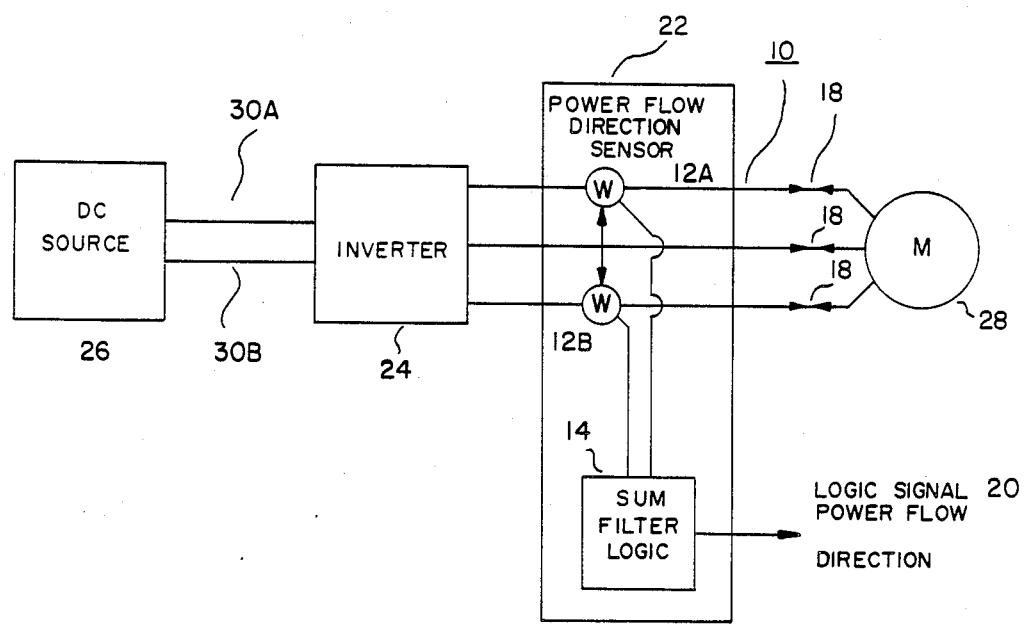
FIG. 2 is a block diagram showing a power flow direction sensor used with an inverter and a motor.

FIG. 2 shows power flow direction sensor 22 used in conjunction with an A C inverter 24 which draws electric energy from direct current source 26. Inverter 24 provides, for example, variable frequency AC current to motor 28. In operation, inverter 24 supplies electric power to motor 28 when motor 28 is driving a load. However, under certain conditions, a load may drive motor 28. When a load drives motor 28 then motor 28 serves as an electric generator and generates electric power which flows through conductors 10 into inverter 24. When motor 28 is working as a generator, then inverter 24 supplies magnetization current to motor 28 through conductors 10, however, the net power flow in conductors 10 is from motor 28 into inverter 24. Inverter 24 is designed to handle electric power delivered to it by motor 28, by, for example, dissipating the power in a resistor, or by converting the power into alternating current and supplying this alternating current to a commercial electric power line (not shown).

Power flow direction sensor 22 has two wattmeters, 12a and 12b, having their outputs connected to sum and filter logic circuit 14. Sum and filter logic circuit 14 generates logic signal 20 in response to the direction of power flow in conductors 10, as discussed hereinabove with reference to FIG. 1.

In an example, inverter 24 may supply an approximately sinusoidal voltage waveform to motor 28. However, in another example inverter 24 may supply pulse width modulated (PWM) voltage waveforms to motor 28. The PWM voltage waveform as supplied between conductors 10 to motor 28 may be clamped to a value dependent upon the voltage between the DC conductors 30A and 30B supplying electric power to inverter 24.

Figure 3:
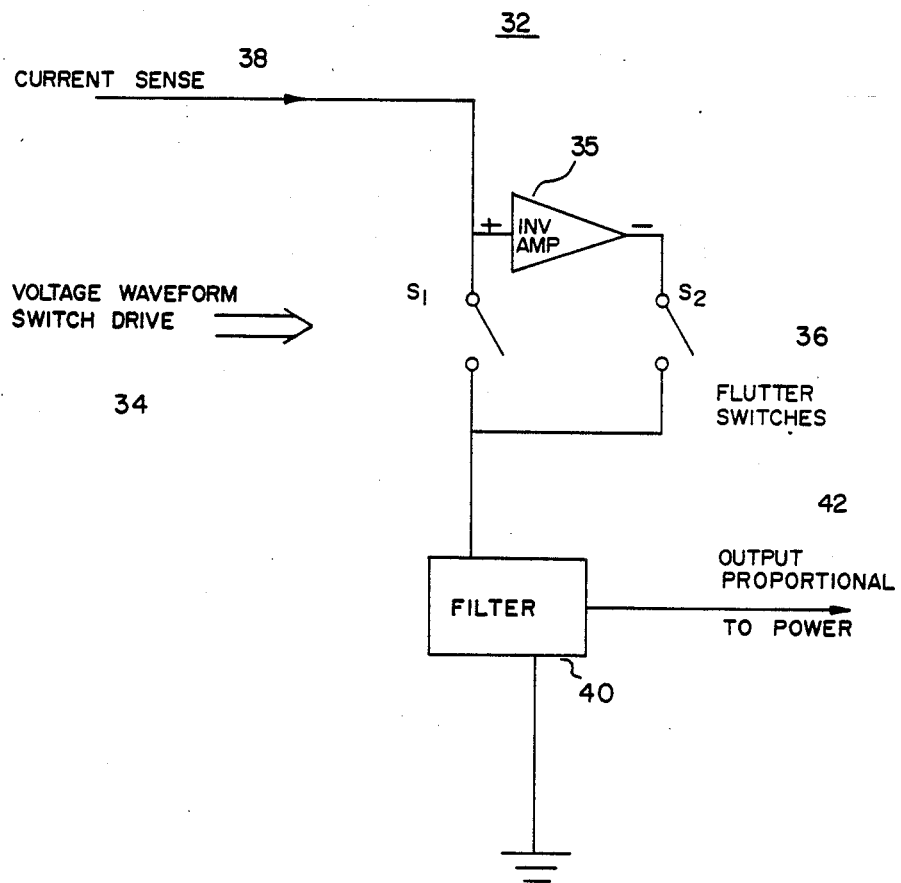
FIG. 3 is a block diagram of a simple flutter switch wattmeter.

FIG. 3 shows a block diagram of a flutter switch wattmeter 32 of a type useful in a power flow direction sensor in the case that conductors 10 carry a pulse width modulated (PWM) voltage waveform. The voltage waveform supplied in conductors 10 generates "voltage waveform switch drive" 34 which drives flutter switches 36, indicated as S1 and S2, to open and close. A current proportional to the current flow in one of the conductors 10 is supplied as a current sense signal 38 to one of the terminals of flutter switches S1, S2. The following analysis assumes that current sense signal 38 is in phase with the corresponding current flow, as for example, the current flow in the corresponding conductor 10.

Current sense signal 38 flows through flutter switch S1 when a positive voltage waveform is present in "voltage waveform switch drive" 34. And current sense signal 38 flows through inverting amplifier 35 and flutter switch S2 when a negative voltage waveform is present in "voltage waveform switch drive" 34. Both flutter switches S1 and S2 are open when the "voltage waveform switch drive" 34 is zero volts. Current flow from signal 38 through either switch S1 or swtich S2 flows into filter 40.

Filter 40 has a time constant appropriate for filtering the carrier frequency of the pulse width modulated voltage waveform supplied to conductors 10. The output 42 of filter 40 is a signal proportional to power flow in the conductors supplying "voltage waveform switch drive" 34 and current sense signal 38. Output 42 has a time variation substantially equal to the fundamental frequency component of the pulse width modulated voltage waveform supplied to conductors 10. Thus, the flutter switches 36 are driven by the "voltage waveform switch drive" 34, the switches permit current sense signal 38 to enter filter 40, and the combination is a simple and effective wattmeter for measuring both power flow and the direction of power flow.

Figure 4:
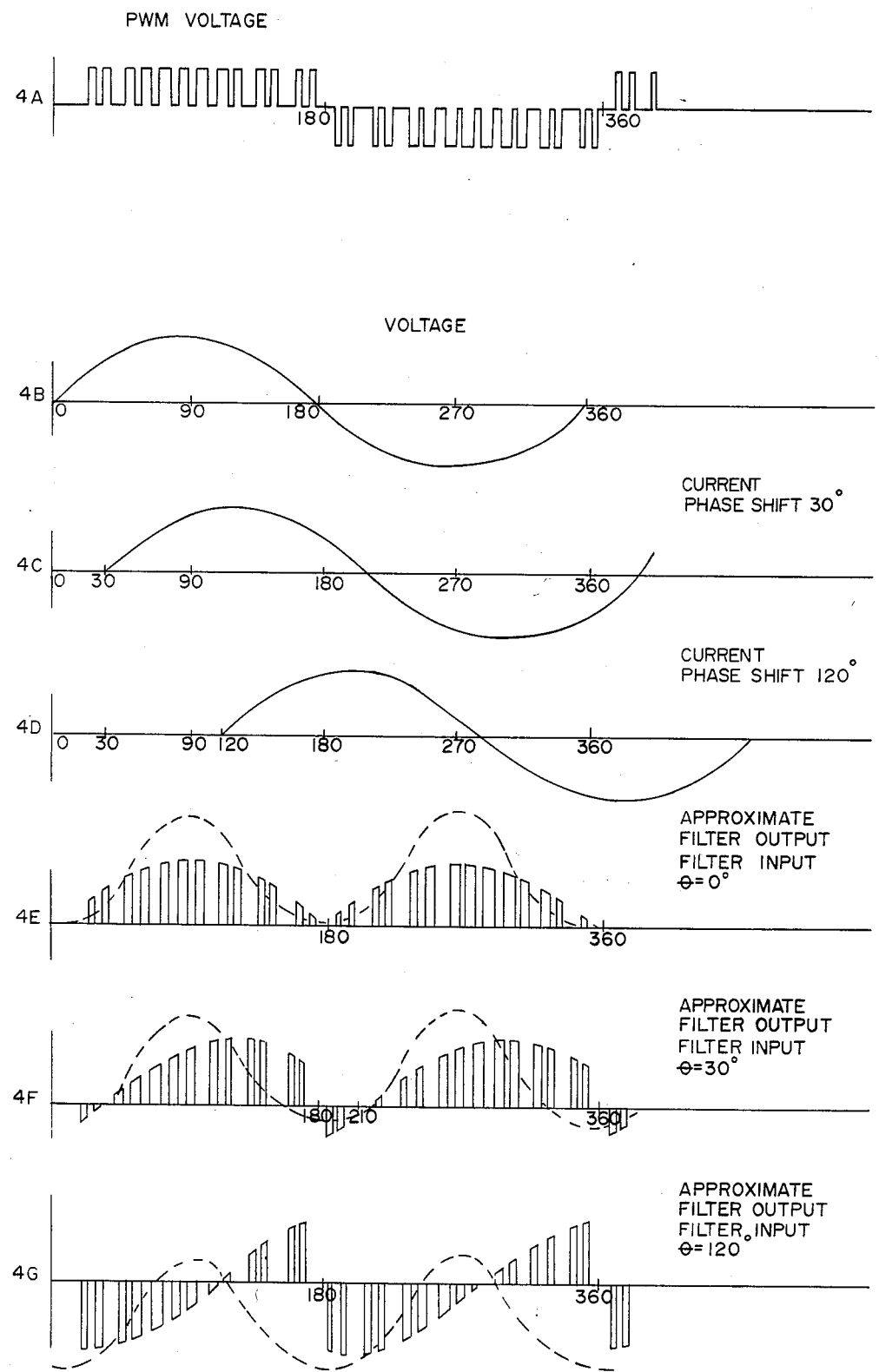
FIGS. 4A-G are graphs of pulse width modulated voltage pulses and resulting currents in a simple flutter switch wattmeter.

FIG. 4 is a group of graphs showing exemplary PWM voltage and current waveforms. The PWM voltage waveform is shown in graph 4A. The fundamental frequency component of the voltage waveform is shown in graph 4B. The fundamental component of the current having phase shift of 30 degrees is shown in graph 4C. And the fundamental frequency component of the current having a phase shift of 120 degrees is shown in graph 4D. The graph 4A labeled "PWM Voltage" shows a pulse width modulated voltage which is designed to approximate a sinusoidal voltage variation. During the first half cycle the pulse width modulated voltages are positive, and during the second half cycle the pulse width modulated voltages are negative. All of the pulse width modulated voltage pulses have the same magnitude. The width of the PWM voltage pulse is narrow at the beginning of a half cycle and narrow at the end of a half cycle, and wider during the middle portion of the half cycle. The variation in pulse width develops the approximation to a sinusoidal voltage variation. Current flowing in the conductors is, in general, phase shifted from the PWM voltage fundamental. Electrical degrees are plotted along the horizontal axis, and the zero degree point is chosen at a time in the cycle where the PWM voltage fundamental crosses from negative voltage to positive voltage. The graph labeled 4C shows current flow having a phase shift of 30 degrees from the PWM voltage fundamental. With a 30 degrees phase shift, the net power flow is from the source of current to a load. In graph 4D there is shown a current flow shifted approximately 120 degrees from the PWM voltage fundamental. Any phase shift greater than 90 degrees from the PWM fundamental is a current in which power flows from the load into the source of current. The load may supply current if the load is, for example, a motor as shown in FIG. 2 as motor 28.

The voltage input to filter 40 for a current flow in phase with the PWM voltage fundamental is shown in graph 4E as a series of pulses shown in solid line. The voltage input is pulsed because it is present only when switch S1 or S2 is closed. The corresponding approximate filter output current is shown as a dashed line in graph 4E. The voltage input pulses to filter 40 are positive both from 0° to 180° and from 180° to 360° because switch S1 is selected when PWM voltage pulses are positive, and switch S2 is selected when PWM pulses are negative. And current sense signal 38 passes through inverting amplifier 35 when switch S2 is closed. The average output current from filter 40 is always positive when the current flow is in phase with the PWM fundamental, as shown by the dashed line in graph 4E.

In graph 4F in input voltage pulses to filter 40 are shown for the case in which the current fundamental is shifted by 30° from the PWM voltage fundamental. As before, switch S1 is selected when PWM voltage pulses are positive and switch S2 is selected when PWM voltage pulses are negative. The resulting voltage pulses applied to filter 40 have negative values from 180° to 180°+30° or 210°, as shown in graph 4F because the current sense current 38 passes through inverting amplifier 35 and switch S2 when PWM voltage pulses are negative. From 210° through 360° the input pulses to filter 40 are positive because the current sense current 38 signal is negative, as shown in graph 4C, and is inverted by inverting amplifier 35. The average filter output current is shown as a dashed line in graph 4F. The average value of the average output current of filter 40 is positive, indicating net power flow, for example, from the current source into a load such as motor 28 of FIG. 2. However, the instantaneous value of the filter 40 output current is negative from 180° to 210°, indicating, for example, power flow from the motor 28 and into inverter 24.

In graph 4G the input voltage pulses to filter 40 are shown for the current fundamental shifted by 120° relative to the PWM voltage fundamental. The average current output of filter 40, shown as a dashed line in graph 4G, gives a negative average value and therefore indicates a net power flow, for example, from motor 28 to inverter 24, as shown in FIG. 2.

Figure 5:
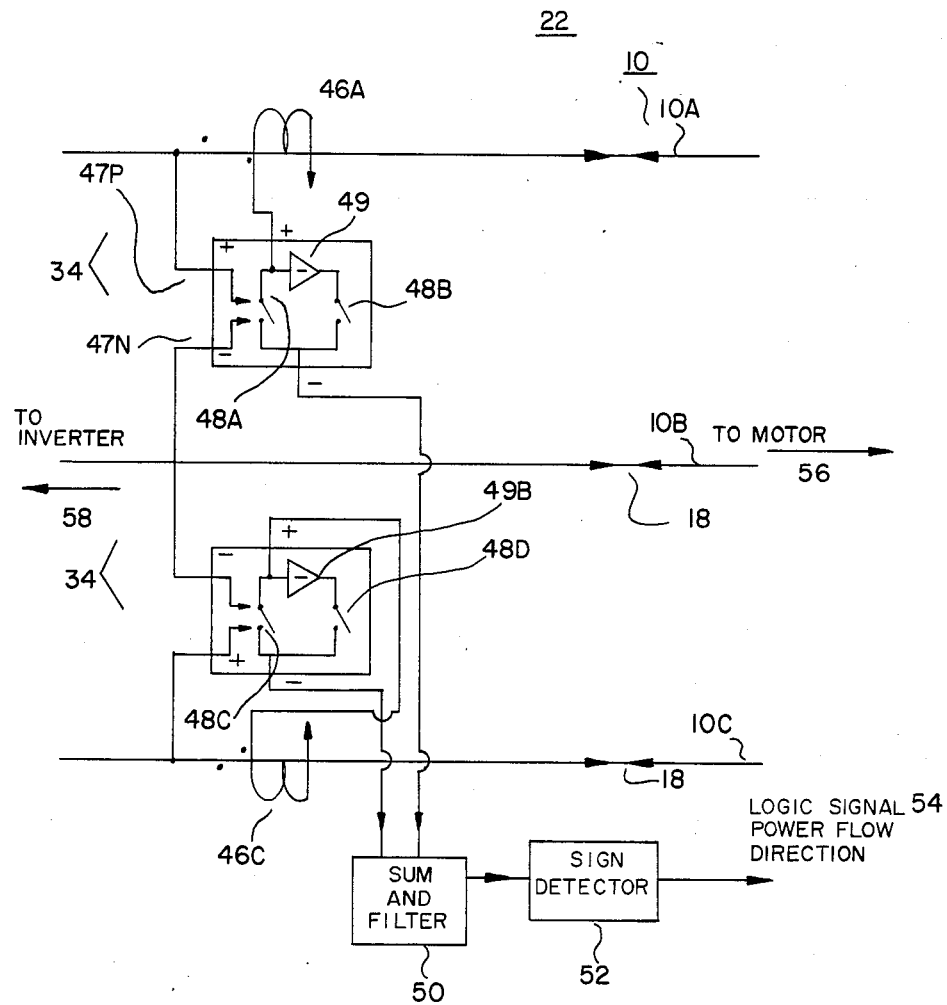
FIG. 5 is a block diagram of a three phase power system using the two wattmeter method for detecting the direction of power flow.

FIG. 5 is a block diagram showing a power flow direction sensor 22 using flutter switch wattmeters. Each of the wattmeters are similar in concept to the flutter switch wattmeter shown in FIG. 3. Current transformer (CT) 46A develops a current flow proportional to the current flow in conductor 10A. The output of current transformer 46A is connected to both a flutter switch 48A and the input of an inverting amplifier 49 (gain of −1). the output of the inverting amplifier 49 is connected to a second flutter switch 48B. A second terminal of each flutter switch 48A and 48B connects to sum and filter circuit 50. Flutter switches 48A and 48B are driven by the voltage from the conductor 10B to conductor 10A, as shown by the connection of conductor 10B to the negative terminal 47N and the connection of conductor 10A to the positive terminal 47P for "voltage waveform switch drive" 34 connections. When the voltage from terminal 47P to 47N is positive, flutter switch 48A closes, and switch 48B remains open. When the voltage from terminal 47P to 47N is negative, flutter switch 48B closes and switch 48A remains open. When flutter switch 48A is closed, current produced by CT 46A flows into sum and filter circuit 50. When flutter switch 48B is closed current produced by CT 46A flows through inverting amplifier 49, through switch 48B, and into sum and filter circuit 50. A flutter switch wattmeter is made up of current transformer 46A, "voltage waveform switch drive" 34 though terminals 47P and 47N, flutter switches 48A, 48B, inverting amplifier 49, and sum and filter circuit 50.

In situations where a pulse width modulated voltage of substantially constant voltage pulses is applied between conductors 10B and 10A, the current flow through flutter switches 48A and 48B is proportional to the power flowing in conductors 10B and 10A.

A second flutter switch wattmeter is made up from CT 46C, flutter switches 48C and 48D, inverting amplifier 49B, "waveform voltage drive" 34 supplied to the negative terminal by connection to conductor 10B and supplied to the positive terminal by connection to conductor 10C, and sum and filter circuit 50. The two flutter switch wattmeters therefore serve the "two wattmeter" method of three phase AC power flow measurement as shown by wattmeter 12A and 12B in FIG. 1 and FIG. 2.

The sign of the output of sum and filter circuit 50 gives an indication of the direction of electric power flow in conductors 10A, 10B, 10C. Sign detector 52 generates logic signal 54 in response to the sign of output of sum and filter circuit 50. For example, logic signal 54 has a first value when electric power flow is in the direction indicated by arrow 56, and has a second value when the electric power flow has the direction indicated by arrow 58. Power flow in the direction indicated by arrow 56 may be toward a motor 28, and power flow in the direction indicated by arrow 58 may be into an inverter 24, as shown in FIG. 2.

Figure 6:
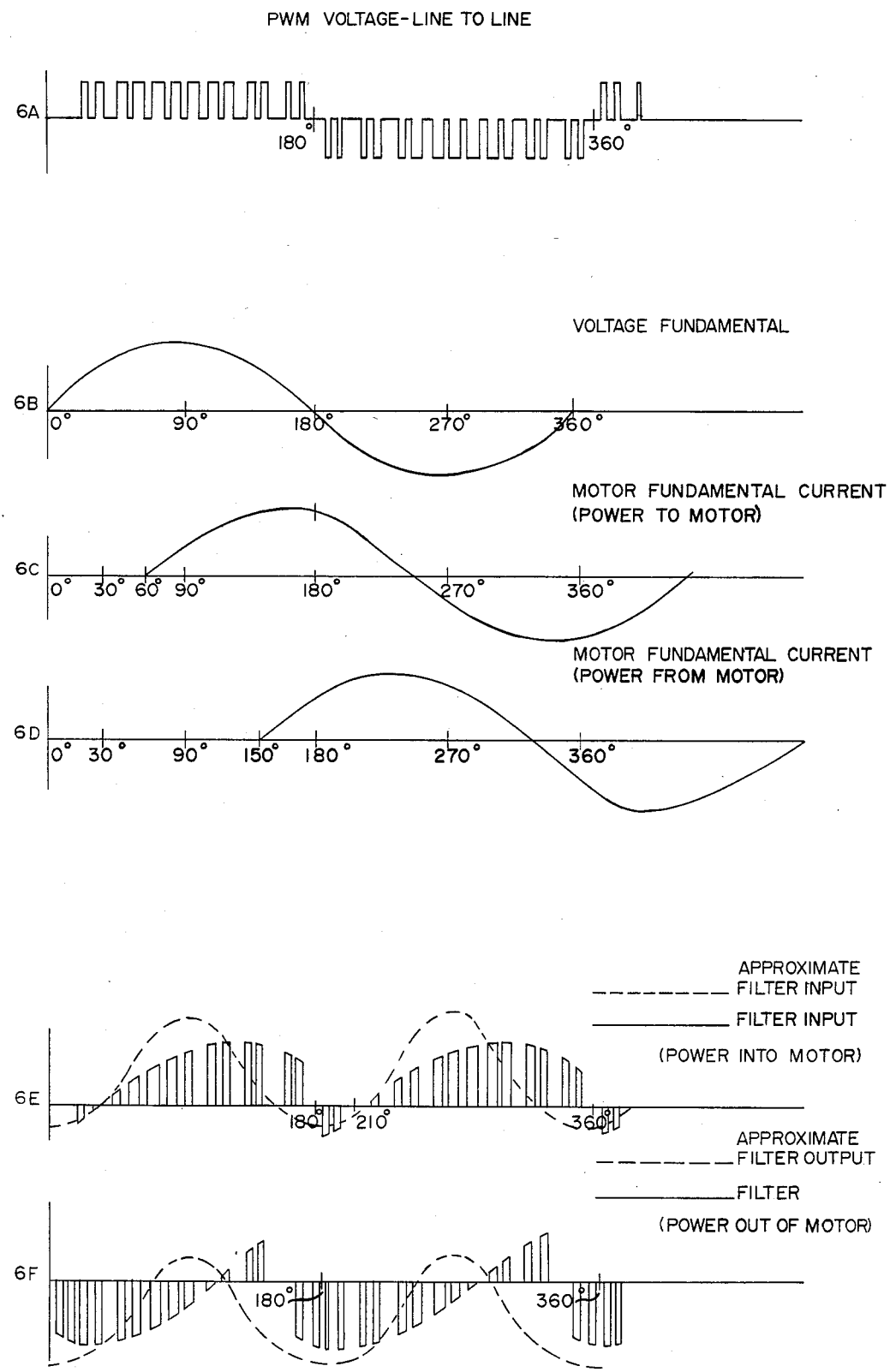
FIGS. 6A-F are graphs of pulse width modulated voltage pulses as measured phase to phase in a three phase system and the resulting current flows.

FIG. 6 shows graphs of voltage wave forms as they appear between two conductors of FIG. 5. Also current flows in a conductor are shown in FIG. 6. The voltages shown are phase to phase voltages. The current flows are phase to neutral current flows. As is well known to those skilled in the art, a phase to neutral flow having a substantially unity power factor will be shifted in phase by 30° from a corresponding phase to phase voltage. And also the phase shift may be either leading or lagging depending upon the phase rotation involved in the three phase system. Graph 6A labeled "PWM Voltage" shows voltage wave forms between two conductors, for example the voltage from conductors 10B and 10A, as in FIG. 2 or FIG. 5. In the exemplary embodiment giving the above PWM voltage waveform, the voltage shifts from positive values to negative values with a time spacing between the shifts so as to develop an AC voltage fundamental frequency having a specified period and approximately a sine wave. Graph 6B labeled "fundamental" shows the fundamental frequency component of the PWM voltage waveform. The graph 6C labeled "Motor Current, Power to Motor" shows a current flow shifted in phase from the fundamental of the voltage waveform, but shifted less than 90°, and therefore represents power flow to the motor in the direction of arrow 56, FIG. 5. Graph 6D labeled "Motor Current Power, From Motor" shows a current flow shifted in phase by more than 90°, and this graph is representative of power flow from the motor to the inverter in the direction of arrow 58, FIG. 5.

Graph 6E shows the voltage input to sum and filter circuit 50 from one flutter switch wattmeter for the case that the current flow from the CT through the switch is phase shifted by 30° from the PWM voltage fundamental, as shown in graph 6C. The width of the input pulses to filter circuit 50 is determined by the width of the PWM pulses as shown in graph 6A. The amplitude is determined by the magnitude of the current graph 6C.

The sign of the pulses in graph 6E is determined by both the PWM voltage pulse triggering either a direct connect switch such as 48A or 48C, or whether the current signal passes through an inverting amplifier such as 49 or 49B. The approximate filter output is shown as a dashed line and is predominantly positive, indicating a net flow of electric power in the direction of arrow 56.

Graph 6F shows the current input pulses to sum and filter circuit 50 for current phase shifted by 120° from the PWM voltage fundamental frequency component. The average approximate filter output is shown in dashed line. The filter output is predominantly negative, indicating a net flow of electric power in the direction of arrow 58.

Figure 7:
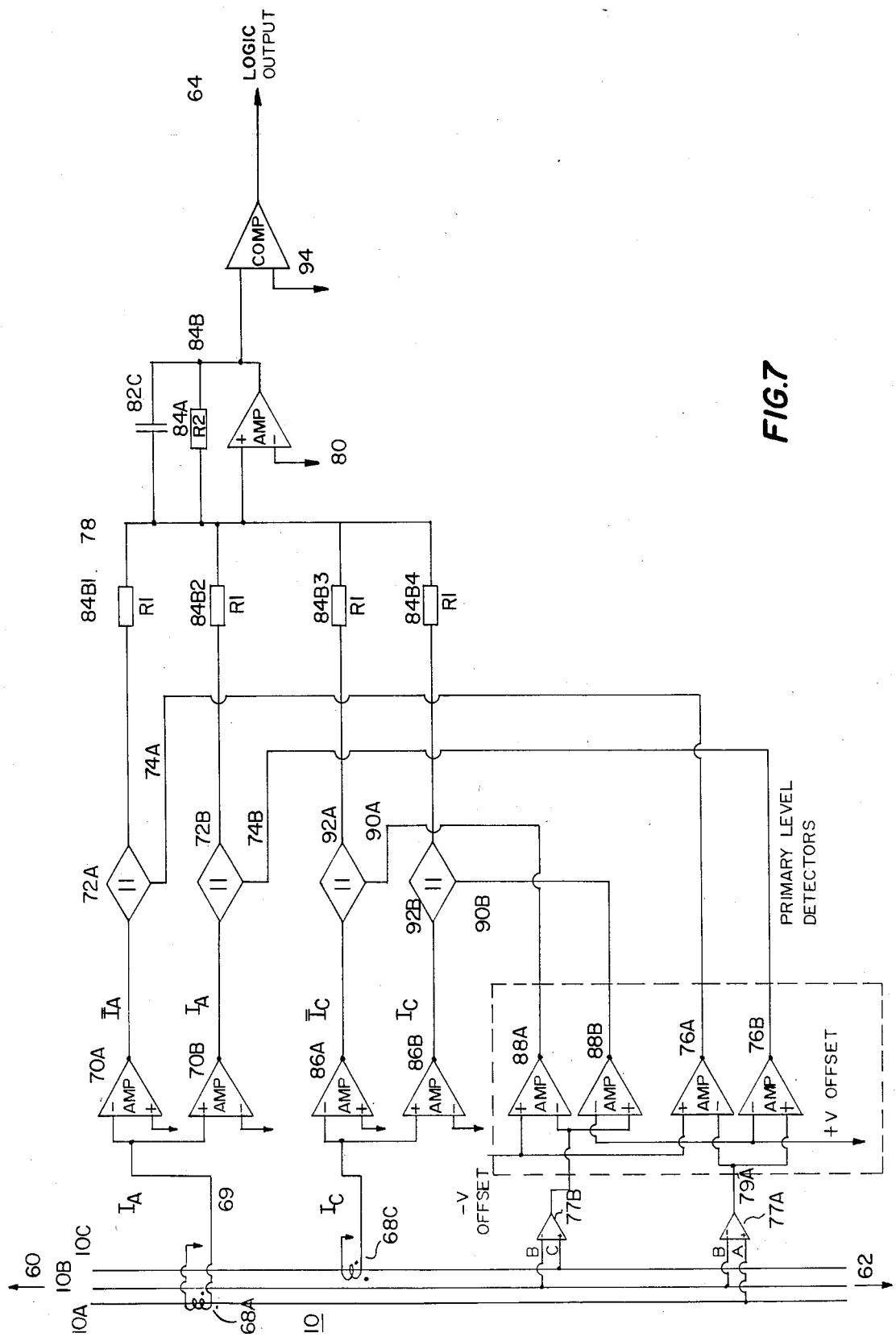
FIG. 7 is a schematic diagram of a three phase AC power flow direction detector.

FIG. 7 shows an exemplary embodiment of a three phase two wattmeter power measurement apparatus using flutter switch wattmeters in order to detect the direction of electric power flow in the conductors of a three phase circuit. Conductors 10A, 10B, and 10C carry three phase electric current. Power flow can be either in the direction of arrow 60 or in the direction of arrow 62. The circuit develops a logic signal 64 having a first value when power flow is in the direction of arrow 60 and a second value when power flow is in the direction of arrow 62.

Current transformer 68A develops an output current proportional to current flow in conductor 10A, and in phase with the current flow in conductor 10A. One side of current transformer 68A connects to ground and the other side connects to two operational amplifiers 70A and 70B. The dots by conductor 10A and current transformer 68A indicate that current flow into current transformer 68A along conductor 10A from the location of the dot causes current to flow out of current transformer 68A through the secondary lead 69 marked by a dot. That is, the convention is that current flow into the primary lead marked by a dot causes current to flow out of the secondary lead marked with a dot. This convention of marking transformers with dots is well known to those skilled in the art of electronics.

Lead 69 of current transformer 68A connects to the negative terminal of operational amplifier 70A and to the positive terminal of operational amplifier 70B. The positive terminal of operational amplifier 70A connects to ground and the negative terminal of operational amplifier 70B connects to ground.

Therefore, operational amplifier 70A develops a positive output voltage at times when the output voltage on lead 69 of current transformer 68A is negative. In contrast, operational amplifier 70B develops a positive output voltage when the output voltage on lead 69 of current transformer 68A is positive.

Electronic switches 72A, 72B, 92A, and 92B have the property that they are closed when a positive signal is applied along the control lead, 74A, 74B, 90A, and 90B, respectively. Thus, electronic switch 72A is closed when a positive signal is applied to lead 74A, and is open for any other potential on lead 74A. Similarly, electronic switch 72B is closed when a positive signal is applied on lead 74B and open for any other signal applied to lead 74B. Similarly, electronic switch 92A is closed when a positive signal is applied to lead 90A, and electronic switch 92B is closed when a positive signal is applied to lead 90B, and the switches are open for any other signal on their respective control leads 90A, 90B.

A control signal 74A is supplied by comparator 76A. Comparator 76A derives its input signal from the voltage between conductors 10B and 10A. Non-inverting amplifier 77A develops an output on line 79A which is connected to the positive terminal of comparator 76B and the negative terminal of comparator of 76A. The negative terminal of comparator 76B connects to +V offset, a positive DC voltage. The positive terminal of comparator 76A connects to −V offset, a negative DC voltage. The offset voltages, +V offset and −V offset, are used to define the output of comparators 76A and 76B when their input on line 79A is zero.

When the potential on conductor 10A is positive relative to the potential on conductor 10B, then non-inverting amplifier 77A develops a positive output signal on line 79A. When the positive signal on line 79A exceeds +V offset it causes comparator 76B to devleop a positive output signal on control lead 74B, thereby closing electronic switch 72B. Also, the positive output signal on line 79A causes comparator 76A to develop a negative output signal on lead 74A, thereby opening electronic switch 72A.

Therefore, when the potential on conductor 10A is positive with respect conductor 10B, and also the current flow in conductor 10A is in the direction of arrow 60, inducing current transformer 68A to make a positive signal in line 69, the positive signal on line 69 flows through amplifier 70B, electronic switch 72B and into summation point 78. The positive signal in line 69 causes amplifier 70B to develop a positive output which flows through electronic switch 72B to summation point 78.

However, a reversed current flow in conductor 10A to the direction of arrow 62 causes current transformer 68A to induce a negative signal on line 69, a negative output from amplifier 70B, and that negative output is connected to summation point 78 through electronic switch 72B. Electronic switch 72B is closed because the voltage on conductor 10A is still positive with respect to conductor 10B. Only the current flow in conductor 10A is reversed.

In contrast, when conductor 10A is negative relative to conductor 10B, the signal on line 79A will be negative and comparators 76A and 76B will cause electronic switch 72B to open and switch 72A to close. With switch 72A closed, a current flow in conductor 10A in the direction of arrow 60 will once again develop a positive signal on line 69, but it will be inverted by amplifier 70A which is connected through switch 72A to summation point 78. Thus a negative signal is applied to summation point 78.

The direction of power flow in conductors 10A and 10B can be related to the sign of the signal at summation point 78. Power flow in the direction of arrow 60 occurs when conductor 10A is positive relative to conductor 10B and current flow along conductor 10A is in the direction of arrow 60, leading to switch 72B being closed, a positive signal on line 69, and a positive signal connected through electronic switch 72B to summation point 78. Also, power flow in the direction of arrow 60 occurs when conductor 10A is negative relative to conductor 10B leading through comparator 76A to closure of switch 72A and a negative signal on line 69. The negative signal on line 69 is inverted by amplifier 70A to a positive signal which is connected through electronic switch 72A to summation point 78. Therefore, power flow in the direction of arrow 60 leads to a positive signal at summation point 78.

The components, amplifier 77A, comparators 76A and 76B, electronic switches 72A and 72B, current transformer 68A, amplifier 70A and 70B, and summation point 78 serve as wattmeter 12A as shown in FIG.

1 and FIG. 2. Similarly, wattmeter 12B is formed by the components amplifier 77B, comparators 88A and 88B, electronic switches 92A and 92B, current transformer 68C, amplifiers 86A and 86B, and summation point 78. Summation point 78 serves as a part of each wattmeter 12A and 12B, and also as the sum part of sum and filter circuit 14. Amplifier 80 serves as the filter portion of circuit 14, along with capacitor 82, resistor 84A and the resistors 84B1, 84B2, 84B3, and 84B4. The resistors 84B1, 84B2, 84B3, and 84B4 are all marked R1 because the same value of resistance may conveniently by employed for each. The resistor 84A is marked R2. The time constant C R2 is chosen to give the desired filter time constant. The ratio of R2/R1 is chosen to obtain the proper gain for amplifier 80.

Comparator 94 compares the filtered output of amplifier 80 against ground potential and develops a logic signal 64 as its output. Logic signal 64 has a first value for power flow in the direction of arrow 60 and a second value for power flow in the direction of arrow 62.

Referring to FIG. 6, it is seen that the PWM voltage between any two of conductors 10A, 10B, or 10C varies rapidly with respect to the fundamental frequency component of both voltage and current. Therefore, the current waveform developed by the current transformers 68A and 68C are sampled rapidly by electronic switches 72A, 72B, 92A, and 92B so that many samples of the current waveform pass through different switches to summation point 78 during one period of the fundamental of the current flow in conductors 10. Therefore, the summation of current flow through electronic switches 72A, 72B, 92A, and 92B as determined at summation point 78 is proportional to the power flow in conductors 10. And logic signal 64 may respond to changes in the direction of power flow in conductors 10 as rapidly as the PWM pattern varies with time. Amplifier 80 along with capacitor 82 and resistor 84A serve as an active filter to filter the carrier frequency of the PWM voltage waveform. The time required for logic signal 64 to respond to a change in direction of power flow in conductors 10 is determined by the filter time constant. The time of response can be lengthened by increasing the C R2 product, thereby increasing the filter time constant of amplifier 80. Conversely, the time of response can be shortened by decreasing the C R2 product. The filter time constant can be set to 0 by setting the capacitance of capacitor 82 to 0, that is omitting capacitor 82 from the circuit, and then the output of the filter is proportional to the instantaneous power delivered to or from the load by the PWM source.

Figure 8:
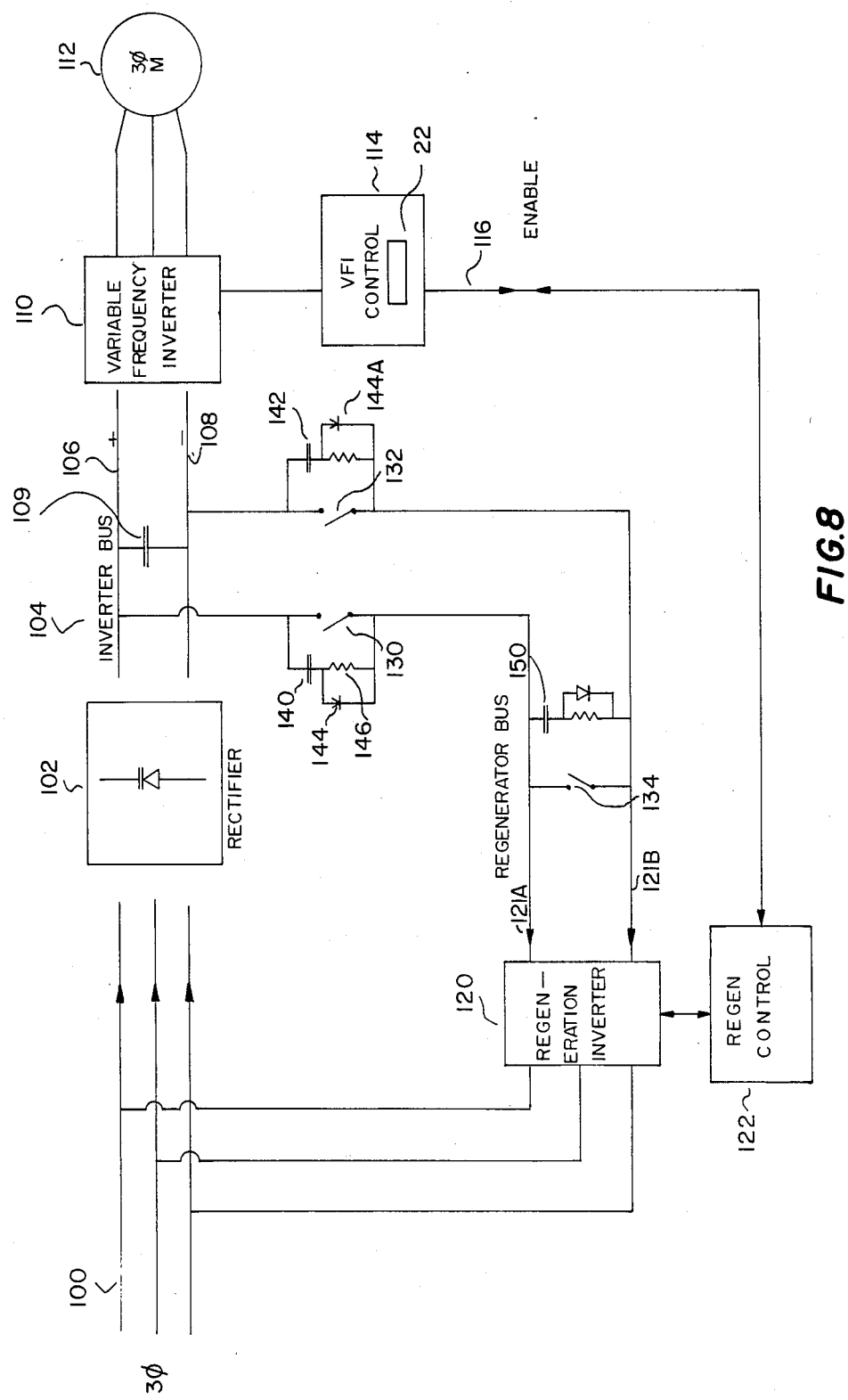
FIG. 8 and FIG. 9 are block diagrams of a variable frequency inverter having a power flow direction detector.

FIG. 8 shows a power flow direction sensor 22 as shown in FIG. 2 utilizing, for example, the circuit shown in FIG. 7, incorporated into VFI control 114, described in more detail hereinbelow. FIG. 8 shows a three phase AC power-line 100 feeding electric current to a rectifier 102 which in turn energizes DC bus 104.

DC bus 104 has a positive conductor 106 and a negative conductor 108. Capacitor 109 is connected between conductors 106 and 108 for the purpose of smoothing variations in bus voltage. DC bus 104 supplied DC electric current to variable frequency inverter (VFI) 110. Variable frequency inverter 110 supplies variable frequency AC current to three phase AC motor 112. Control of variable frequency inverter 110 is supplied by VFI control 114. Also variable frequency inverter 110 serves as a source of power to the DC bus under conditions wherein motor 112 functions as a generator.

Motor 112 may function as a generator when it is driven by the load. Under conditions wherein motor 112 functions as a generator energy flows from motor 112 into DC bus 104, thereby increasing the DC voltage between conductors 106 and 108, and adding charge to capacitor 109. The power flow from motor 112 into DC bus 104 is deteceted by VFI control 114. Upon detection of power flow from motor 112 into DC bus 104, the VFI control 114 generates an "enable" signal on line 116. The "enable" signal on line 116 commands regeneration inverter 120, through regen control 122, to direct electric current into AC power line 110 from DC bus 104. Regen control 122 commands solid state switches in regeneration inverter 120 to fire at the correct times to deliver electric current into each of the phases of three phase power line 100. Current is delivered to three phase power line 100 at the times that the phase to neutral voltage is near a maximum, so that the energy is delivered to line 100 at approximately unity power factor in each of the phases.

The regeneration inverter 120 is fed by DC regenerator bus 121. Positive conductor 121 A of regenerator bus 121 is connected through switch 130 to positive conductor 106 of inverter bus 104. Negative conductor 121 B of regenerator bus 121 is connected through switch 132 to negative conductor 108 of inverter bus 104.

The logic signal 64 developed by the circuit shown in FIG. 7 serves as an enable signal 116 which is applied to regen control 122. When power flow develops from motor 112, power flow direction sensor 22 generates enable signal 116 which turn on regen control 122 and starts the regeneration inverter 120. Regeneration inverter delivers the power flow coming from motor 112 into electric power lines 100.

Figure 9:
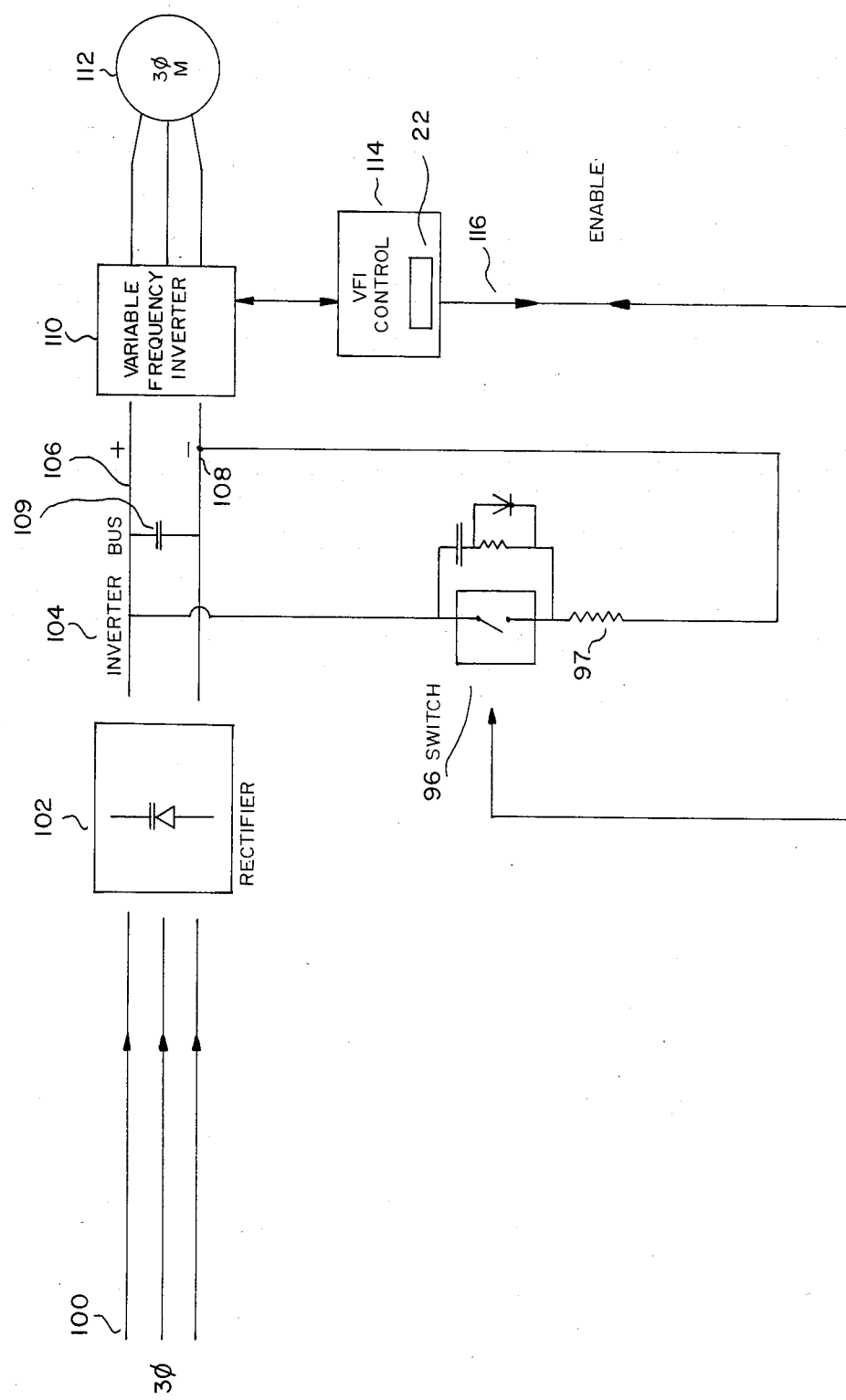

FIG. 9 shows a power flow direction sensor 22, incorporated into VFI control 114. The apparatus shown in FIG. 9 is an inverter 110, for example, a variable frequency inverter driving an AC motor 112, and using a power resistor 97 to dissipate electric power generated when motor 112 is operating in overhaul conditions. Power flow direction sensor 22 generates enable signal 116 by, for example, logic signal 64 as developed by the circuit shown in FIG. 7, and turns on switch 96. Switch 96 connects power dump resistor 97 across DC bus conductors 106 and 108 in order to dissipate electric energy delivered by motor 112 through inverter 110 to the DC bus. The arrangement in FIG. 9 is termed "dynamic braking."

The detailed description of the invention has been given hereinabove for a three phase AC electric power line. The invention will work equally well for a general AC power line of an arbitrary number of phases. One wattmeter is necessary for measurement of power flow in a single phase AC power line. Two wattmeters are necessary for measurement of power flow on a three phase line, and the number of wattmeters needed for measurement of power flow in power lines employing different numbers of phases are well known to those skilled in the art. The invention will work with the requesite number of wattmeters needed to measure power flow on an AC power line having a specified number of phases.

The invention described herein achieves both good accuracy and rapid response to power flow direction and magnitude changes using a simple and inexpensive circuit. The response may be as rapid as the PWM pulses shift as a function of time.

The circuit is applicable to "N" wire systems, both for alternating current and for switched direct current. As used herein N is an arbitrary number of wires, provided that N−1 wattmeter elements are used. The circuit may be employed to indicate both magnitude and direction of power flow for pulse width modulation of either current or voltage.

The circuit function by converting a trinary PWM waveform into its three constituent components. The trinary waveform three constituent components are a magnitude of 0 and magnitude of positive quantity, and a magnitude of negative quantity. The quantities are fixed as either a fixed voltage or a fixed current which is switched so that it can be either positive or negative. The PWM information is used to sample the other parameter, either current or voltage. Thus, the resultant waveforms are sampled in synchronism with the PWM modulated waveform. This sampling mathematically "weights" the resultant sampled waveform according to the trinary shape of the PWM waveform. Summing the "weighted" segments of the resultant waveform computes the instantaneous power in the circuit. The magnitude of the computed instantaneous power represents power flow in the circuit while the sign of the computed value represents the direction of power flow.

The invention as described hereinabove may be used to determine both the magnitude and direction of power flow in a variety of commonly used inverter schemes. As a first example, the invention may be used in a voltage source inverter, as described hereinabove. In a voltage source inverter, the DC bus voltage is held constant and a PWM circuit controls the voltage applied to the load. The current flow through the load is then determined by the PWM voltage applied to the load and the impedance of the load.

As a second example, the invention may be conveniently used to measure the direction of power flow to or from a load in a six (6) step type inverter. In a six step type inverter the inverter controls the frequency applied to the load. In order to vary the average voltage applied to the load, it is necessary to vary the bus DC voltage. The current flow is then the resultant current from the applied frequency and applied average voltage and the impedance of the load.

As a third example, an inverter may operate from a fixed current source and have a pulse width modulated current. The current is turned off and on and the average "on" time gives the average current flow through the load. The voltage that develops across the terminals of the load is then determined by the average current flow, the frequency of the current produced by the PWM signal, and the impedance of the load. In this arrangement, the inverter controls both the current and the frequency at which that current is applied to the load. The invention serves well to measure the magnitude and direction of power flow in a fixed current source PWM inverter arrangement. The chopper switches in the wattmeters are driven by the current PWM signal and the current flow through the switches is proportional to the voltage developed across the load.

As a fourth example, the invention serves to measure the direction of power flow in a fixed current source inverter using a six step inverter. In a six step current source inverter the inverter controls only the frequency of the current flow to the load. It is necessary to vary the magnitude of the current supplied by the current source in order to vary the average current to the load. The voltage developed across the terminals of the load then depends upon the average current applied, the frequency provided by the inverter, and the impedance of the load.

In use on a current source inverter the connections as shown in FIG. 7 must be changed so that the PWM signal operates the sampling switch. The sampling switch is then connected so that current flow through the sampling switch is proportional to the voltage developed across the load.

In six step inverters as described above, the invention measures only the direction of power flow and not the magnitude of power flow into or out of the load.

The reason that magnitude is not measured by the invention is that the bus quantity is caused to vary and is then simply switched off and on by the inverter at the required frequency. No PWM is developed by the switching. The difference in magnitude of the quantity on the bus is not applied to the circuit of FIG. 7 and so the circuit will not register the magnitude of power flow. However, by simply multiplying the output obtained, for example, at point 84B as shown in FIG. 7, by the magnitude of the quantity on the bus, it is possible for the invention to measure the magnitude of power flow as well as the direction of power flow in six step type inverters.

The invention as described hereinabove operates most simply on a PWM power system. However, the invention will measure the direction of power flow in a non-PWM power system in an arrangement where the electronic switches such as 72A, 72B, 92A, and 92B are triggered by a threshold setting for voltage or current and the current flow through the switches is proportional to the other (voltage or current) quantity. A quantative, or semiquantative, measure of the magnitude of power flow may be obtained in these cases by multiplying the output at point 84B by the magnitude of the quantity driving the control element of the chopper switches 72A, 72B, 92A, and 92B.

Figure 10:
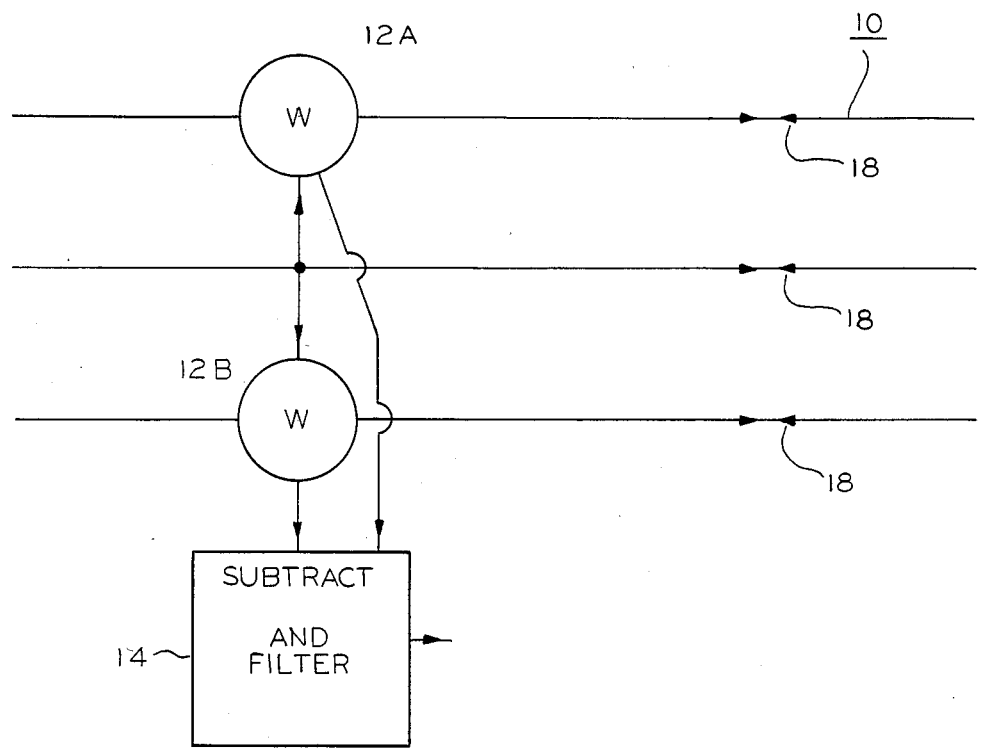
FIG. 10 is a block diagram showing two wattmeters connected for reactive power measurement.

Reactive power flow magnitude and also direction of reactive power flow can be measured by a simple change in the invention as described hereinabove, as shown in FIG. 10. By subtracting the reading of one wattmeter output from the reading of a second wattmeter output the resultant of the subtraction is a measure of reactive power. Reactive power may be measured by the invention on all of the four above discussed inverter embodiments.

Various features of AC inverter designs incorporating the invention disclosed herein are more fully disclosed in the following U.S. patent applications, all of which are assigned to the assignee of the within U.S. Patent application, and all of which are filed on even date with the within application for U.S. patent: "DC Bus Shorting Apparatus and Method for AC Inverter", Inventors, J. C. Guyeska, J. M. Liptak, R. W. Roof, Ser. No. 677,709, all disclosures of which are incorporated herein by reference; "Current Regulated Switching Regulator", Inventor, R. W. Roof, Ser. No. 677,729, all disclosures of which are incorporated herein by reference; "DC Bus Voltage Regulation by Controlling the Frequency in a Variable Frequency Inverter", Inventor, F. C. Joyner, Jr., Ser. No. 677,730, all disclosures of which are incorporated herein by reference.

It is to be understood that the above-described embodiments are simply illustrative of the principles of the invention. Various other modifications and changes may be made by those skilled in the art which will embody the principles of the invention and fall within the spirit and scope thereof.

I claim:

1. An apparatus for measuring the direction of power flow through conductors connecting a load to a source of alternating electric current, said load being capable of generating electric current, and said source of alternating electric current being capable of accepting power flow from said load, comprising:
   said source generating a pulsed supply voltage across said load and having a load current flowing in said load in response to said pulsed supply voltage;
   at least one switch having contacts that close and open in response to said pulsed supply voltage turning on and turning off;
   at least one sense electric current substantially proportional to said load current, and said sense electric current connected to flow through said contacts whereby the average electric current flow through said contacts is substantially proportional to an electric power flowing in said load;
   a detector for detecting a sign of said power flowing in said load and generating an indicator signal responsive to said sign, said indicator signal having a first value when said power flows from said source of alternating electric current into said load and said indicator signal having a second value when power flows from said load into said source of alternating electric current.

2. The apparatus as in claim 1 wherein said conductors comprise a single phase alternating current circuit.

3. An apparatus as in claim 1 wherein said conductors comprise a three phase alternating current circuit.

4. An apparatus as in claim 1 wherein said conductors comprise an N phase alternating current circuit.

5. An apparatus as in claim 1 wherein said conductors comprise a two wire direct current circuit.

6. An apparatus as in claim 1 wherein said conductors comprise an N wire direct current circuit.

7. An apparatus as in claim 1 wherein said at least one switch and said sense electric current are connected so as to give the reactive power flow into or out of said load, and the sign of said output is the direction of flow of reactive power.

8. An apparatus comprising:
   a DC source of electric current;
   a motor capable of generating electric power;
   inverter means connected to said DC source for generating a pulsed supply voltage across said motor, and said motor having a motor current flowing in response to said pulsed supply voltage;
   at least one switch having contacts that close in response to said pulsed supply voltage turning on and open in response to said pulsed supply voltage turning off;
   at least one sense electric current substantially proportional to said motor current, and said sense electric current connected to flow through said contacts whereby the average electric current flow through said contacts is substantially proportional to an electric power flowing in said motor;
   a detector for detecting a sign of said power flowing in said motor and capable of generating an indicator signal responsive to said sign, said indicator signal having a first value when said power flows from said inverter into said motor and said indicator signal having a second value when power flows from said motor into said inverter.

9. The apparatus as in claim 8 wherein said DC source of electric current draws its current from an alternating current power line.

10. The apparatus as in claim 8 wherein said indicator signal enables a second inverter when power flows from said motor into said inverter, and said second inverter directs power generated by said motor to a three phase alternating current power line.

11. The apparatus as in claim 8 wherein said indicator signal enables a switch which closes and dissipates electric power generated by said motor in a resistor.

12. The apparatus of claim 8 wherein said inverter includes:
   a VFI control means for controlling the output of said inverter and for directing the flow of current from said DC source, said VFI control means responsive to said indicator signal; and
   a power receiver means for receiving excess power from said DC source when said indicator signal indicates power is flowing from said motor and said VFI control means directs current from said DC source to said power receiver.

13. The apparatus of claim 12, wherein:
   said power receiver is a regeneration inverter supplying power to a load, said regeneration inverter including a regeneration control activating said regeneration inverter in response to an enable signal issued by said VFI control means.

14. An apparatus for measuring power flow through conductors connecting a load to a source of electric current, said load being capable of generating electric current, and said source of electric current being capable of accepting power flow from said load, comprising:
   said source generating a pulsed supply voltage across said load, and said load having a load current flowing in response to said pulsed supply voltage;
   at least one switch having contacts that close in response to said pulsed supply voltage turning on and open in response to said pulsed supply voltage turning off; and
   at least one sense electric current substantially proportional to said load current, and said sense electric current connected to flow through said contacts whereby the average electric current flow through said contacts is substantially proportional to an electric power flowing in said load.

15. The apparatus as in claims 1, 8 or 14 wherein said pulsed supply voltage is a pulse width modulated supply voltage.

16. The apparatus as in claims 1, 8 or 14 further comprising:
   an integrator having an input proportional to said electric power flowing in said load and having an output proportional to a time average of said electric power flowing in said load.

17. An apparatus for measuring electric power flow in a three phase alternating current power line having a first conductor, a second conductor, and a third conductor, and supplied by a pulse width modulated voltage, comprising:
   a first current sensor (68A) responsive to current flow in said first conductor (10A);
   a first operational amplifier (70A) and a second operational amplifiers (70B), said first current sensor connected to a negative input terminal of said first operational amplifier and a positive input terminal of said second operational amplifier;

a first electronic switch (72A) and a second electronic switch (72B), said first electronic switch (72A) having an input connected to an output of said first operational amplifier (70A), an output connected to a first end of a first resistor (84B1), and a control terminal (74A), said second electronic switch (72B) having an input connected to an output of said second operational amplifier (70B), an output connected to a first end of a second resistor (84B2), and a control terminal (74B), a second end of said first resistor (84B1) and a second end of said second resistor (84B2) connected to form a summation point (78);

a first isolation amplifier (77A) having a first input connected to said first conductor (10A) and a second input connected to said second conductor (10B), and an output;

a first comparator (76A) and a second comparator (76B), said output of said first isolation amplifier (77A) connected to a first input terminal of said first comparator (76A) and a first input terminal of said second comparator (76B), a second input terminal of said first comparator (76A) connected to a negative DC offset voltage and a second input terminal of said second comparator (76B) connected to a positive DC offset voltage, whereby said first comparator and said second comparator provide output logic signals indicative of the presence and polarity of voltage between said first conductor (10A) and said second conductor (10B);

an output of said first comparator (76A) connected to said control terminal (74A) of said first electronic switch (72A), and an output of said second comparator (76B) connected to said control terminal (74B) of said second electronic switch (72B), thereby providing a first flutter switch wattmeter operating synchronously with said pulse width modulated voltage;

a second current sensor (68C) responsive to current flow in said third conductor (10C);

a third operational amplifier (86A) and a fourth operational amplifier (86B), said second current sensor connected to a negative input terminal of said third operational amplifier and a positive input terminal of said second operational amplifier;

a third electronic switch (92A) and a fourth electronic switch (92B), said third electronic switch (92A) having an input connected to an output of said third operational amplifier (86A), an output connected to a first end of a third resistor (84B3), and a control terminal (90A), said fourth electronic switch (92B) having an input connected to an output of said fourth operational amplifier (86B), an output connected to a first end of a fourth resistor (84B4), and a control terminal (90B), a second end of said third resistor (84B3) and a second end of said fourth resistor (84B4) connected to said summation point (78);

a second isolation amplifier (77B) having a first input connected to said second conductor (10B) and a second input connected to said third conductor (10C), and an output;

a third comparator (88A) and a fourth comparator (88B), said output of said second isolation amplifier (77B) connected to a first input terminal of said third comparator (88A) and a first input terminal of said fourth comparator (88B), a second input terminal of said third comparator (88A) connected to a negative DC offset voltage and a second input terminal of said fourth comparator connected to a positive DC offset voltage, whereby said third comparator and said fourth comparator provide output logic signals indicative of the presence and polarity of voltage between said second conductor (10B) and said third conductor (10C);

an output of said third comparator (88A) connected to said control terminal (90A) of said third electronic switch (92A), and an output of said fourth comparator (88B) connected to said control terminal (90B) of said fourth electronic switch (92B), thereby providing a second flutter switch wattmeter operating synchronously with said pulse width modulated voltage;

and a voltage is developed at said summation point (78) substantially proportional to electric power flow in said three phase alternating current power line, and a sign of said voltage indicates a direction of flow of said electric power flow.

18. The apparatus as in claim 17 further comprising:
a filter having an input connected to said summation point (78) and an output, said output providing a voltage substantially proportional to a time average of said voltage developed at said summation point (78); and, a fifth comparator (94) having an input connected to said output of said filter, said fifth comparator (94) providing a first logic output value when said output voltage of said filter is positive and providing a second logic output value when said output voltage of said filter is negative.

19. The apparatus as in claim 18 wherein said filter comprises:
a fifth operational amplifier having an input connected to said summation point, and having an amplifier output, said amplifier output providing said output of said filter;

a capacitor (82) connected between said input and said amplifier output of said fifth operational amplifier; and, a resistor (84A) connected in parallel with said capacitor (82), thereby providing an integrator as said filter.

20. An apparatus for measuring the direction of power flow through conductors connecting a load to a source of alternating electric current, said source generating a pulsed supply voltage across said load, said load having a load current flowing in load and being capable of generating electric power, and said source of alternating electric current being capable of accepting power flow from said load, said apparatus comprising:
at least one switch having contacts that close and open in response to said pulsed supply voltage turning on and turning off;

at least one sense electric current substantially proportional to said load current, and said sense electric current connected to flow through said contacts whereby the average electric current flow through said contacts is substantially proportional to an electric power flowing in said load;

a detector for detecting a sign of said power flowing in said load and generating an indicator signal responsive to said sign, said indicator signal having a first value when said power flows from said source of alternating electric current into said load and said indicator signal having a second value when power flows from said load into said source of alternating electric current.

* * * * *